United States Patent [19]

Ikeda et al.

[11] 4,404,233
[45] Sep. 13, 1983

[54] ION IMPLANTING METHOD

[75] Inventors: Tadashi Ikeda; Norikazu Tsumita, both of Kodaira; Yutaka Sugita, Tokorozawa, all of Japan

[73] Assignee: Hitachi, Ltd., Tokyo, Japan

[21] Appl. No.: 224,743

[22] Filed: Jan. 13, 1981

[30] Foreign Application Priority Data

Jan. 23, 1980 [JP] Japan .................................. 55-5754

[51] Int. Cl.³ .............................................. B05D 3/06
[52] U.S. Cl. ................................ 427/35; 204/192 N; 427/38
[58] Field of Search ........................... 427/38, 130, 35; 204/192 N; 148/1.5

[56] References Cited

U.S. PATENT DOCUMENTS

| | | | |
|---|---|---|---|
| 3,792,452 | 2/1974 | Dixon et al. | 427/38 |
| 3,873,371 | 3/1975 | Wolf | 427/35 |
| 3,914,857 | 10/1975 | Goser et al. | 148/1.5 |
| 4,030,997 | 6/1977 | Miller et al. | 427/35 |
| 4,108,751 | 8/1978 | King | 204/192 N |
| 4,250,009 | 2/1981 | Cuomo et al. | 204/192 N |
| 4,274,935 | 6/1981 | Schmelzer et al. | 204/192 N |
| 4,275,286 | 6/1981 | Hackett | 427/35 |

Primary Examiner—S. L. Childs
Attorney, Agent, or Firm—Antonelli, Terry & Wands

[57] ABSTRACT

The ion implantation is performed in a manner to vary the angle between an ion beam and an article to be implanted with ions, whereby it can be accomplished with remarkable ease while providing the impurity distribution which is flattened in the depthwise direction.

6 Claims, 6 Drawing Figures

ION IMPLANTING METHOD

BACKGROUND OF THE INVENTION

1. Field of the Invention

The present invention relates to an ion implanting method, and more particularly to an ion implanting method which can remarkably reduce the fluctuations of an impurity concentration to be implanted in the depthwise direction.

2. Description of the Prior Art

In a magnetic bubble memory element, as is well known in the art, a bias field is applied to a magnetic film, which has a uniaxial magnetic anisotropy, such as a magnetic garnet film thereby to form magnetic bubbles, by which the memory action is effected.

In order to increase the memory density of the magnetic bubble memory element, recently, the diameter of the magnetic bubbles is remarkably reduced, and the practice of an element using minute bubbles having a diameter equal to or smaller than 2 μm is earnestly promoted.

If, the diameter of the magnetic bubbles is reduced, however, it is quite natural that the propagation patterns to be used for their propagation will become remarkably minute. The precise formation of such minute propagation pattern is considerably difficult, raising the maximum difficulty in realizing the element having the minute bubbles.

More specifically, the propagation pattern of the magnetic bubble memory element generally uses the so-called "chevron or TI pattern", which is formed by photo-lithography.

The minimum line width that can be precisely formed by the photo-lithography has its limit at about 2 μm, thus making it difficult to form such a fine pattern precisely with excellent reproductivity as has a smaller line width than 2 μm.

Especially the clearance between adjacent patterns (which will be shortly referred to as "the gap") has to be made smaller than the aforementioned line width. The existing photo-lithography has failed to precisely form such minute gap, thus making it remarkably difficult to make the magnetic bubbles minute.

In order to solve the problems thus far described thereby to make the propagation of the minute bubbles possible, there has been proposed a CD element which uses neither the conventional chevron nor TI pattern but a propagation pattern having no gap.

The CD element is characterized, as diagrammatically shown in FIG. 1, in that a magnetic bubble propagation circuit 1 is of a shape having discs chained (and is called "the contiguous disc pattern", which is shortly referred to as "the CD pattern") and in that there is no gap in the propagation circuit so that magnetic bubbles 2 are propagated along the outer edge portion of the propagation circuit 1.

As shown in FIGS. 1 and 2, more specifically, a chain-shaped mask 1' made of a photoresist or an alloy of gold or aluminum-copper is formed on a magnetic film 4 which is so formed on a non-magnetic substrate 3, while having a uniaxial anisotropy, that it can hold the magnetic bubbles, and hydrogen, helium or other ions 5 are implanted into the remaining exposed portion thereby to form an ion-implanted region 6. The portion covered with the mask 1' has no ion implanted area to provide such a propagation circuit as is shown in FIG. 1.

In this instance, the kind of the ions implanted and the voltage for the implantation are so selected that the ions reach one third depth from the surface of the magnetic film 4 thereby to establish distortion in the crystal lattice of the magnetic film 4.

For example, in case a film of $(YSmLuCa)_3(GeFe)_5O_{12}$ having a thickness of 1.5 μm is used as the aforementioned magnetic film 4, it is sufficient to implant the He ions at a voltage of 150 KeV.

Since the bubble (or magnetic) film for the CD element is generally so selected as to have a negative magnetostriction constant, the magnetization will lie parallel to the film plane due to the adverse effect of the magnetostriction if the crystal is subjected to the compressive stress as a result of the ion implantation. As shown in FIG. 2, consequently, the direction 7 of magnetization of the surface region 6, which is not covered with the chain-shaped mask 1' so that it is implanted with the ions, lies parallel to the film plane so that "the magnetic wall having magnetic charges" (which is usually called "the charged wall") is formed in the boundary of the CD pattern by the application of inplane magnetic field.

The bubbles 2 existing in the boundary are either attracted or repulsed by the charged wall so that they can be propagated by applying a revolving magnetic field from the outside thereby to shift the position of the charged wall.

As is apparent from the foregoing description, the CD element has to be formed with the charged wall so as to propagate the bubbles. For this purpose, the inplane magnetization has to be established in the vicinity of the surface of the bubble films.

Generally speaking, however, as the bubbles are made the more minute, the uniaxial anisotropy energy Ku ($=\frac{1}{2}M_sH_k$, wherein Hk indicates the anisotropy field) required for the bubbles to stably exist is increased the more.

In order to establish the inplane magnetization required for providing the charged wall, therefore, the magnetostriction anisotropy energy Ki ($=3/2\lambda_s\sigma_s$, wherein $\lambda_s$ indicates an inplane magnetostriction constant; and $\sigma_s$ indicates an inplane stress.) required for overcoming the increased Ku is increased.

Of these, however, the inplane magnetostriction constant $\lambda_s$ is determined by the kind of the bubble magnetic films, and the remaining quantity having a high degree of freedom is limited to the inplane stress $\sigma_s$, the limit of which is the elastic limit of the crystal lattice.

In case a single kind of ions are implanted with a single energy into the bubble films, generally speaking, the distortion established in the films as a result of the ion implantation is distributed substantially in accordance with the Gaussian distribution about the depth $R_p$, which is determined by the kind of the ions and the voltage for the implantation, while following the shape of a curve a indicated in broken line in FIG. 3. In this Figure: the abscissa indicates the depth of the ions implanted from the surface; and ordinate indicates a relative etching rate. Since the etching rate is increased the more for the larger distortion, the ordinate corresponds to the amplitude of the distortion.

As is apparent from the curve a of FIG. 3, the ions cannot be implanted uniformly in the depthwise direction, if the single ions are implanted with a single energy as by the ion implanting method in current use according to the prior art. As a result, the distribution of the distortion in the depthwise direction cannot be made uniform thereby to make it difficult to establish the uniform distribution of distortion required for the CD element.

SUMMARY OF THE INVENTION

It is therefore an object of the present invention to provide an ion implanting method which makes it possible to establish not a Gaussian distribution but a depthwise uniform impurity distribution while solving the problems concomitant with the prior art.

Another object of the present invention is to provide an ion implanting method which enables a uniform distortion to distribute at a desired depth in a magnetic garnet film.

In order to achieve the aforementioned objects, in accordance with the present invention, the ion implantation is accomplished while varying the angle of an article to be implanted with ions, such as, the magnetic garnet with respect to the direction of an ion beam.

DETAILED DESCRIPTION OF THE PREFERRED EMBODIMENT

The present invention will be described in detail in the following in connection with the embodiment thereof. If the single ions are implanted with an equal energy, as indicated in the curve a, the impurity distribution takes the shape of the Gaussian distribution.

Such distribution can have its width enlarged by repeating the implantations a plurality of times with the kinds of the ions and the voltages for implantation being changed.

Figure 1:
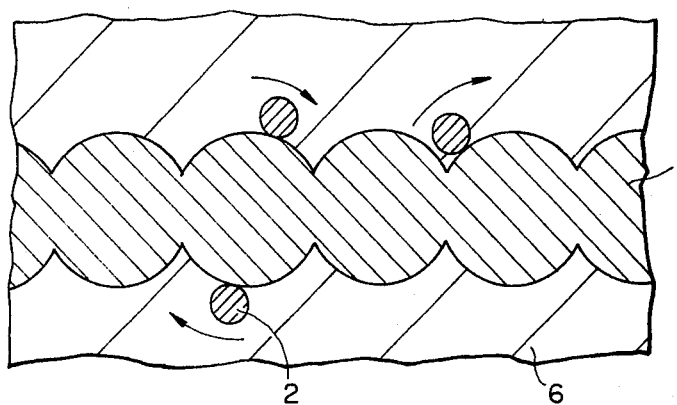
FIGS. 1 and 2 are a top plan view and a sectional view showing the shape and producing method of a CD pattern, respectively.
Figure 2:
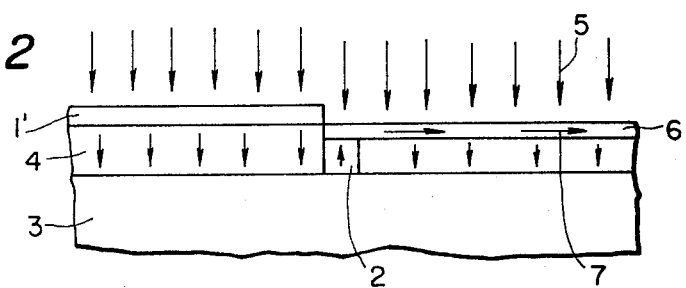
Figure 3:
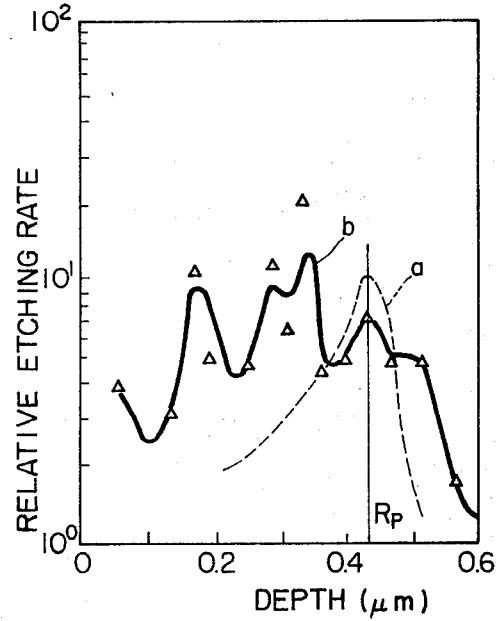
FIG. 3 is graph of the characteristic curves showing the depthwise distribution of the distortion obtained by the ion implantation.

If the ion implantations are performed three times with Ne+ of $1 \times 10^{14}/cm^2$ at 80 KeV, with Ne+ of $2 \times 10^{14}/cm^2$ at 270 KeV and with H+ of $2 \times 10^{16}/cm^2$ at 130 KeV, the impurity distribution obtained takes the shape of curve b of FIG. 3.

As is apparent from the comparison between the curves a and b, the width of the impurity distribution can be enlarged be repeating the ion implantations while varying the kinds of the ions and the acceleration voltages. If these treatments are performed, the product can be used as the film of a CD element.

The method described in the above is proposed at present as the producing method of the film for the CD element, but the repetitions of the ion implantations with the kinds of the ions and the acceleration voltages being varied are, in nature, remarkably troublesome in practice.

Moreover, it is necessary to use ions having a small atomic radius in order to implant the ions deeply apart from the surface. However, since the ions having a small atomic radius have a small effect for establishing the distortion, it is necessary to implant many ions, while taking much time, so as to establish a desired quantity of distortion.

The present invention resides in that the width of the impurity distribution is enlarged by changing the angles of an article to be ion-implanted, such as a magnetic garnet with respect to the ion beam thereby to flatten the impurity distribution by eliminating the steep peaks thereof.

As is well known in the art, more specifically, the conventional ion implantations are performed by either arranging the surface of an article to be ion-implanted, e.g., a bubble film and an ion beam substantially at a right angle or inclining them at 4 to 10 degrees but not by varying the angles between that article and the ion beam.

Figure 4:
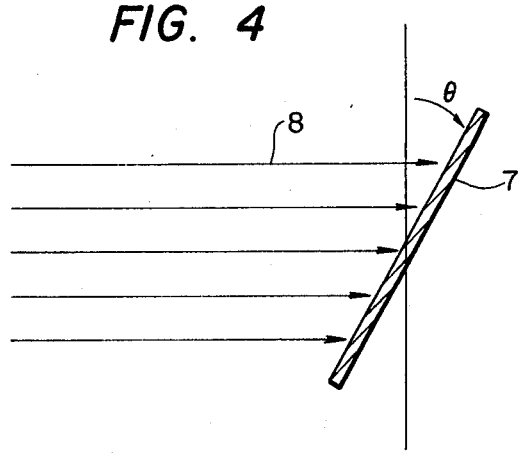
FIGS. 4 and 5 are schematic views for explaining the principle of the present invention.

According to the present invention, however, the ion implantations are not performed by fixing the angle between the article to be ion-implanted and the ion beam by gradually varying in a manual or automatic manner the angle $\theta$ between an article to be ion-implanted 8, e.g., a bubble film and an ion beam 8, as schematically shown in FIG. 4.

If this method is followed, the depth of ion implantation is varied in accordance with the angle $\theta$ between the normal and the film 7 of the direction of the ion beam 8 so that an ion-implanted region having a large distribution width is formed.

Figure 5:
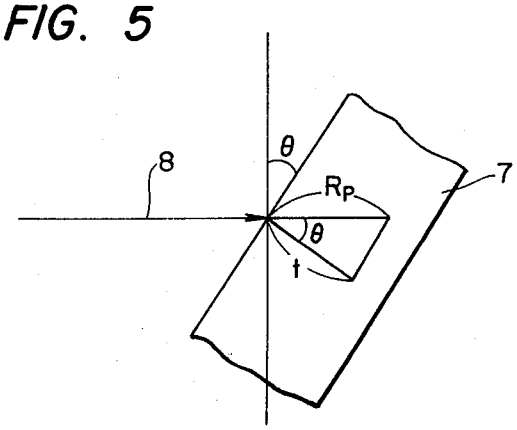

FIG. 5 is a view showing the formation of the region implanted with the ions. The concentration distribution of the ion-implanted region, which is formed by the first ion implantation, becomes similar to the Gaussian distribution having a depth $R_p$ as its peak, as shown in FIG. 3. However, since the angle $\theta$ between the film 7 and the direction of the ion beam 8 is not a right one, the perpendicular depth t of the peak, where the ion concentration takes its maximum, is expressed, in this instance, not by $R_p$ but by $Rp \cos \theta$.

If the ion implantations are performed by gradually varying the angle $\theta$, consequently, the perpendicular depth t, where the ion concentration distribution takes its peak, can be changed into various values so that the ion-implanted region having its depthwise concentration distribution flattened over a wide range can be formed without varying the acceleration voltages and the kinds of the ions.

For $\theta = 90$ degrees, i.e., if the surface of the film 7 is arranged in parallel with the direction of the ion beam 8, the perpendicular depth t takes a value of 0. In order to establish the distribution which is flat from the surface to a desired depth, therefore, it is apparently sufficient that the film 7 is turned or reciprocated within a range having the angle $\theta$ from 90 degrees to a desired value.

There arises no difficulty no matter which the turns or reciprocations of the bubble film 7 within the range having the angle $\theta$ from the 90 degrees to the desired value might be performed either continuously or intermittently.

EXAMPLE

Helium ions were implanted under the conditions of an implantation voltage of 150 KeV, a dose of $2 \times 10^{15}/cm^2$ and the angles of $\theta$ of 0.,30 and 60 degrees into a film of $(YSmLuCa)_3(FeGe)_5O_{12}$ having a thickness of 1.7 $\mu m$ thereby to produce a CD element.

Figure 6:
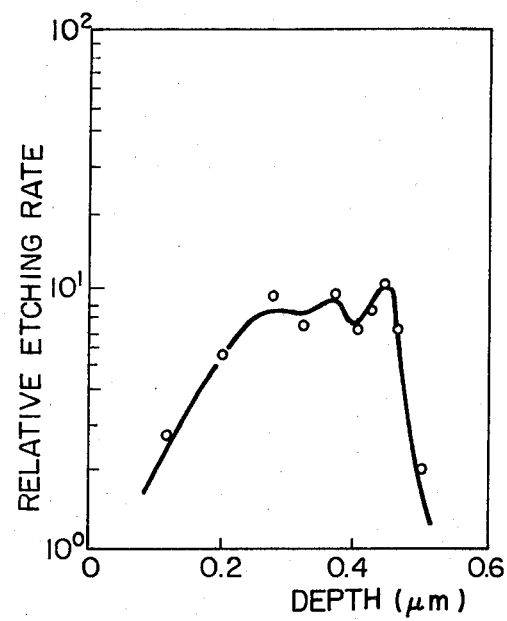
FIG. 6 is a graph of the characteristic curve obtained by one embodiment of the present invention.

The distribution of the distortion thus obtained in the depthwise direction is shown in FIG. 6. As is apparent from the comparison with the result (as indicated at the curve a in FIG. 3) when the implantation was performed for $\theta=0$, it is confirmed that the distribution of the distortion in the film was remarkably widened, while having its peak flattened, by performing the implantations with the angle between the film and the direction of the ion beam being varied.

With the use of the film thus formed, on the other hand, the CD element was produced (with a pattern period of 8 μm), and the magnetic bubbles having a diameter of 1.7 μm were propagated with a margin higher than 10% for a revolving magnetic field of 50 Oe.

Thus, according to the present invention, the ion implantations are performed while varying the angle between the article to be ion-implanted and the ion beam. In order to vary the angle inbetween, it is sufficient that the article to be ion-implanted, e.g., the magnetic film be turned, as is apparent from FIGS. 4 and 5.

These turns may be accomplished either in a manual manner or by an automatic manner using a stepping motor or a timer. No matter which manner is adopted, it is needless to say that the turns by a desired angle and at a desired speed can be performed far more easily than the conventional method, in which the values of the implantation voltage and the kinds of the ions are varied.

As is now apparent from the foregoing description, according to the present invention, the width of the ion distribution in the depthwise direction in the article to be ion-implanted can be enlarged, and the peak of the ion concentration can be flattened remarkably easily both by such a remarkable simple method, in which the ion implantations are performed by varying the angle between that article and the ion beam.

The present invention can be applied to a variety of aspects but can remarkably enjoy a practical value when applied to the production of the CD element.

What is claimed is:

1. An ion implanting method of forming an ion-implanted region in a magnetic film to be ion-implanted by irradiating a desired portion of said film with an ion beam directed at an angle to said film,
    wherein the improvement resides in that the irradiation of said ion beam is performed in a manner to vary the angle between said ion beam and the desired portion of said film whereby the peak of the ion concentration is flattened.

2. An ion implanting method according to claim 1, wherein said film is a magnetic film for a contiguous element.

3. An ion implanting method according to claim 1 or 2, wherein the angle between said ion beam and said film is varied either continuously or intermittently.

4. An ion implanting method according to claim 3, wherein the angle between said ion beam and said film is varied either automatically or manually.

5. An ion implanting method according to claim 1, wherein said ion beam is directed onto said portion of said film so that an angle $\theta$ between the normal of the surface of the film and the direction of the ion beam is varied gradually in a range of from 0° to 90°.

6. An ion-implanting method according to claim 1, wherein said ion beam is directed at an angle to said film in such a manner as to gradually vary the angle between said ion beam and said film.

* * * * *